United States Patent
Kim et al.

(10) Patent No.: US 6,573,168 B2
(45) Date of Patent: *Jun. 3, 2003

(54) METHODS FOR FORMING CONDUCTIVE CONTACT BODY FOR INTEGRATED CIRCUITS USING DUMMY DIELECTRIC LAYER

(75) Inventors: Ji-soo Kim, Kyungki-do (KR); Chang-woong Chu, Kyungki-do (KR); Dong-hyun Kim, Kyungki-do (KR); Yong-chul Oh, Kyungki-do (KR); Hyoung-joon Kim, Seoul (KR); Byeong-yun Nam, Kyungki-do (KR); Kyung-won Park, Kyungki-do (KR); Sang-hyeop Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 30 days.

This patent is subject to a terminal disclaimer.

(21) Appl. No.: 09/866,323

(22) Filed: May 25, 2001

(65) Prior Publication Data

US 2002/0001889 A1 Jan. 3, 2002

(30) Foreign Application Priority Data

Jun. 28, 2000 (KR) .......................................... 2000-35950

(51) Int. Cl.⁷ .......................................... H01L 21/3205
(52) U.S. Cl. ...................... 438/586; 438/618; 438/710
(58) Field of Search ................................. 438/586, 253, 438/710, 183, 587, 618, 597, 184

(56) References Cited

U.S. PATENT DOCUMENTS

| 5,547,900 A | 8/1996 | Lin ............................ 437/187 |
| 6,255,160 B1 * | 7/2001 | Huang ........................ 438/238 |
| 6,342,452 B1 * | 1/2002 | Coronel et al. ............. 438/532 |
| 6,429,107 B2 * | 8/2002 | Kim et al. .................. 438/586 |

FOREIGN PATENT DOCUMENTS

KR 98-5439 3/1998

* cited by examiner

Primary Examiner—William David Coleman
(74) Attorney, Agent, or Firm—Myers Bigel Sibley & Sajovec

(57) ABSTRACT

Methods are provided for conductively contacting an integrated circuit, including a plurality of spaced apart lines thereon, using a dummy dielectric layer. A dummy dielectric layer is formed between first selected ones of the spaced apart lines. An interdielectric layer is formed between second selected ones of the spaced apart lines that are different from the first selected ones of the lines. The interdielectric layer has a lower etch rate than the dummy dielectric layer with respect to a predetermined etchant. The dummy dielectric layer is etched with the predetermined etchant, to remove at least some of the dummy dielectric layer between the first selected ones of the spaced apart lines. A conductive layer is formed between the first selected ones of the spaced apart lines from which at least some of the dummy dielectric layer has been removed, to electrically contact the integrated circuit between the first selected ones of the spaced apart lines.

34 Claims, 12 Drawing Sheets

US 6,573,168 B2

METHODS FOR FORMING CONDUCTIVE CONTACT BODY FOR INTEGRATED CIRCUITS USING DUMMY DIELECTRIC LAYER

RELATED APPLICATION

This application claims the benefit of Korean Patent Application No. 2000-35950, filed Jun. 28, 2000, the disclosure of which is hereby incorporated herein by reference in its entirety as if set forth fully herein.

FIELD OF THE INVENTION

The present invention relates to methods for manufacturing integrated circuit devices, and more particularly, to methods for forming conductive contact bodies in an interdielectric layer.

BACKGROUND OF THE INVENTION

As the integration density of integrated circuit devices increases, misalignment margin in photolithographic processes may become narrower. As a result, it may not be easy to obtain a sufficient misalignment margin when manufacturing the integrated circuit devices. Thus, an electrical short-circuit can occur between a gate line and a contact pad adjacent to the gate line, between a bit line and a buried contact (BC) adjacent to the bit line, and/or between the gate line and the BC or a direct contact (DC).

In order to overcome this problem, Self-Aligned Contact (SAC) etching processes have been implemented. However, SAC etching processes may have limitations with respect to failure to open a contact hole and/or selectivity.

More specifically, in order to obtain a high selectivity, the etching process may be implemented as a polymer enrich process, which is an etching process that generates enriched polymer during etching. However, this etching process may generate a lag in etching similar to Reactive Ion Etching (RIE). Dry etching performed under these conditions may deteriorate the uniformity of the dry etching on a substrate, thus making it desirable to increase the amount of over etching. This can cause the selectivity to be reduced.

Also, the high-integration density of integrated circuit devices may make it desirable to increase the aspect ratio of a contact hole being filled with a contact body. In order to obtain an adequate insulating shoulder, an adequate thickness of silicon nitride ($Si_3N_4$) may need to remain on the top and sides of a gate or wires. As a result, in order to obtain an adequate selectivity when forming a contact hole by SAC etching, it may be desirable to increase the thickness of a hard mask or of a spacer, formed of silicon nitride ($Si_3N_4$). This may cause the aspect ratio of the contact hole to further increase.

Due to the increase in the aspect ratio of the contact hole, it may be more difficult to obtain a sufficient bottom critical dimension of the contact hole. As a result, a defect may occur, in which the hole does not open properly. However, it may be difficult to avoid an increase in the aspect ratio due to the above insulating shoulder.

SUMMARY OF THE INVENTION

Embodiments of the present invention provide methods of conductively contacting an integrated circuit including a plurality of spaced apart lines thereon, using a dummy dielectric layer. In particular, a dummy dielectric layer is formed between first selected ones of the spaced apart lines. An interdielectric layer is formed between second selected ones of the spaced apart lines that are different from the first selected ones of the lines. The interdielectric layer has a lower etch rate than the dummy dielectric layer with respect to a predetermined etchant. The dummy dielectric layer is etched with the predetermined etchant, to remove at least some of the dummy dielectric layer between the first selected ones of the spaced apart lines. A conductive layer is formed between the first selected ones of the spaced apart lines from which at least some of the dummy dielectric layer has been removed, to electrically contact the integrated circuit between the first selected ones of the spaced apart lines. Accordingly, embodiments of the invention can reduce and preferably prevent electrical short circuits, and also can reduce and preferably prevent the likelihood of a contact hole not opening.

Other embodiments of the invention form a plurality of conductive lines, including a line-type conductive pattern and a shielding dielectric layer on sides and tops of the conductive pattern, on an integrated circuit substrate. A dummy dielectric layer is formed in gaps between the conductive lines. The dummy dielectric layer is patterned to produce a dummy opening that selectively exposes some of the gaps between the conductive lines. An interdielectric layer is formed, in the dummy opening. The dummy dielectric layer pattern is selectively removed using the interdielectric layer pattern as an etching mask, to form a contact opening. A conductive layer is formed in the contact opening and that is electrically connected to the substrate. The conductive layer is etched to separate the conductive layer into conductive contact bodies surrounded by the shielding dielectric layer and the interdielectric layer pattern.

According to still other embodiments, a conductive contact body of an integrated circuit device is formed, by forming a plurality of conductive lines including a line-type conductive pattern on a lower dielectric layer on an integrated circuit substrate, a spacer on the sides of the conductive pattern and a hard mask on tops of the conductive pattern. The lower dielectric layer is selectively etched using the hard mask and the spacer as an etching mask, to expose the substrate. A stopper layer is formed that covers the hard mask, the spacer, and the exposed substrate. A dummy dielectric layer is formed in gaps between the conductive lines on the stopper layer. The dummy dielectric layer is patterned to produce a dummy opening that selectively exposes some of the gaps between the conductive lines. An interdielectric layer pattern is formed in the dummy opening that selectively exposes the dummy dielectric layer. The dummy dielectric layer pattern is selectively removed using the interdielectric layer pattern as an etching mask, to form a contact opening that exposes the stopper layer beneath the dummy dielectric layer pattern. The stopper layer that is exposed by the contact opening is removed, and a conductive layer is formed in the contact opening and that is electrically connected to the substrate. The conductive layer is etched to separate the conductive layer into conductive contact bodies surrounded by the spacer and the interdielectric layer pattern.

Accordingly, embodiments of the present invention can reduce the likelihood of damaging a conductive pattern such as a gate or bit line. Embodiments of the invention also can reduce or prevent a spacer or a hard mask, which protects the sidewalls and/or tops of a conductive pattern, from being damaged while forming a conductive contact line.

BRIEF DESCRIPTION OF THE DRAWINGS

FIGS. 1A and 1B through FIGS. 6A and 6B are plan views and sectional views illustrating embodiments of the present invention.

DETAILED DESCRIPTION OF PREFERRED EMBODIMENTS

Figure 1A:
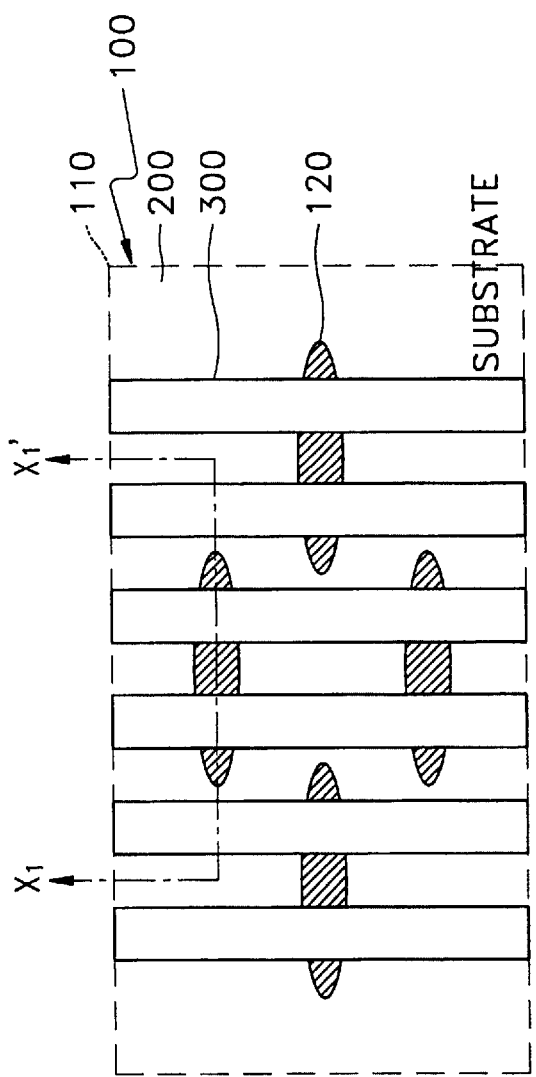

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the forms of elements are exaggerated for clarity. Like numbers refer to like elements throughout. It will be understood that when an element such as a layer, region or substrate is referred to as being "on" another element, it can be directly on the other element or intervening elements may also be present.

Embodiments of the present invention form a contact opening for exposing a portion in which a contact body will be formed. A dummy or sacrificial dielectric layer comprised of insulating materials having a high etch-rate and an interdielectric layer having a low etch-rate compared to that of the dummy dielectric layer are used. The dummy dielectric layer is selectively removed using the high etching selectivity provided between the dummy dielectric layer and the interdielectric layer.

In embodiments of the present invention, in order to form the contact opening, the dummy dielectric layer is selectively patterned, thereby forming a dummy opening which exposes a portion in which the contact body is not to be formed. The interdielectric layer is formed to fill the dummy opening. Then, the patterned dummy dielectric layer is removed to form the contact opening The contact opening is filled with a conductive material layer which is divided into the contact body by using etching or polishing. Since a very high dry etching selectivity is not needed according to embodiments of the present invention, in contrast to a conventional self aligned contact (SAC), embodiments of the present invention can allow a decrease in a design rule and the increase in an aspect ratio.

Figure 1B:
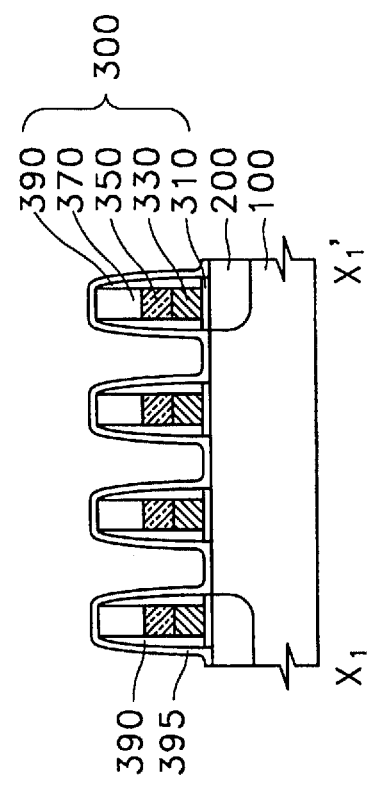

FIG. 1A is a plan view schematically illustrating the step of forming gate lines 300 on an integrated circuit substrate such as a semiconductor substrate 100, and FIG. 1B is a sectional view taken along line $X_1$–$X_1$' of FIG. 1A, according to embodiments of the present invention.

In detail, the gate line stack 300 is formed of a line-type (i.e. spaced apart lines) on the semiconductor substrate 100 using a conventional process of manufacturing a transistor. For example, after forming isolation regions 200 on the semiconductor substrate 100 using a shallow trench isolation (STI) process, gates 330 and 350 are formed in a line-type conductive pattern so as to intersect an active region 120 defined by the isolation regions 200.

The gates 330 and 350 are formed by interposing a gate oxide layer 310 between the gates 330 and 350 and the substrate 100. The gates 330 and 350 can be formed of various conductive materials. For example, the gates 330 and 350 can be formed by sequentially forming a polycrystalline silicon layer 330 and a silicide layer 350 on the gate oxide layer 310 and patterning them. The silicide layer 350 can be formed of metal silicide such as tungsten silicide (WSi). Also, the gates can also be formed of metal materials such as tungsten (W).

Before patterning the gates 330 and 350, a hard mask 370 is formed by depositing insulating materials, for example, silicon nitride ($Si_3N_4$) and/or silicon dioxide ($SiO_2$) on the layer 350. The hard mask 370 may be formed of silicon oxynitride (SiON), silicon carbide (SiC) and/or aluminum oxide ($Al_2O_3$). When the hard mask 370 is formed of silicon oxide ($SiO_2$), preferably, a silicon oxide layer is formed by a deposition method for increasing film density, for example, by a chemical vapor deposition (CVD) based method such as chemical vapor deposition (CVD) or plasma enhanced-CVD (PE-CVD), atmospheric pressure-CVD (AP-CVD) and/or high density plasma-CVD (HDP-CVD). This can implement a high etching selectivity of the hard mask 370 for a process of forming the contact body. This also can prevent the hard mask 370 from being damaged, and then the gates 330 and 350 are exposed. The hard mask 370 is patterned together when patterning the gates 330 and 350 and shields the top of the gates 330 and 350 to protect them. Here, the thickness of the hard mask 370 can be varied according to the processing conditions. However, the thickness of the hard mask 370 is preferably about 500 Å through 1500 Å in a case where the hard mask 370 is formed of silicon nitride ($Si_3N_4$).

After the gates 330 and 350 are formed, a spacer 390 for covering the sidewalls of the gates 330 and 350 is formed using a conventional spacer processing. The spacer 390 can be formed of an insulating material such as silicon nitride ($Si_3N_4$) and/or silicon dioxide ($SiO_2$). When forming the spacer 390 of silicon dioxide ($SiO_2$), as described above, in order to prevent the spacer 390 from being damaged and exposing the sidewalls of the gates 330 and 350 in a later process of forming the contact body, the spacer 390 may be formed to have a high density so as to provide a high selectivity. For example, the silicon oxide layer forming the spacer 390 is formed using CVD or PE-CVD. Also, the spacer 390 can be formed of silicon oxynitride (SiON), silicon carbide (SiC) and/or aluminum oxide ($Al_2O_3$).

As described above, after forming the gate lines 300 comprising the gates 330 and 350, the spacer 390 on the sidewalls of the gates 330 and 350 and the hard mask 370 on the tops of the gates 330 and 350, a stopper layer 395 for covering the spacer 390 and the hard mask 370 may be further formed. The stopper layer 395 can be used as the end point of etching in an etching process and/or a polishing process used in the later process of forming the contact body. Also, the stopper layer 395 can help to prevent the spacer 390 or the hard mask 370 from being damaged and exposing the gates 330 and 350 in the etching or polishing processes.

Thus, the stopper layer 395 is formed so as to cover the spacer 390 and the hard mask 370 and is preferably formed of an insulating material such as silicon nitride ($Si_3N_4$) so as to obtain a high selectivity in the following process. However, besides silicon nitride ($Si_3N_4$), the stopper layer 395 can be formed of silicon oxynitride (SiON), silicon carbide (SiC) and/or aluminum oxide ($Al_2O_3$), which have a low dry or wet etch-rate.

The spacer 390, the hard mask 370 and/or the stopper layer 395 are used as a shielding dielectric layer for protecting a conductive pattern such as the gates 330 and 350 from the following etching process.

The problems of the SAC process due to the integration of semiconductor devices as described previously may usually occur in a cell region 110 of the substrate 100. Thus, the following description of embodiments of the present invention is focused on the cell region 110.

Figure 2A:
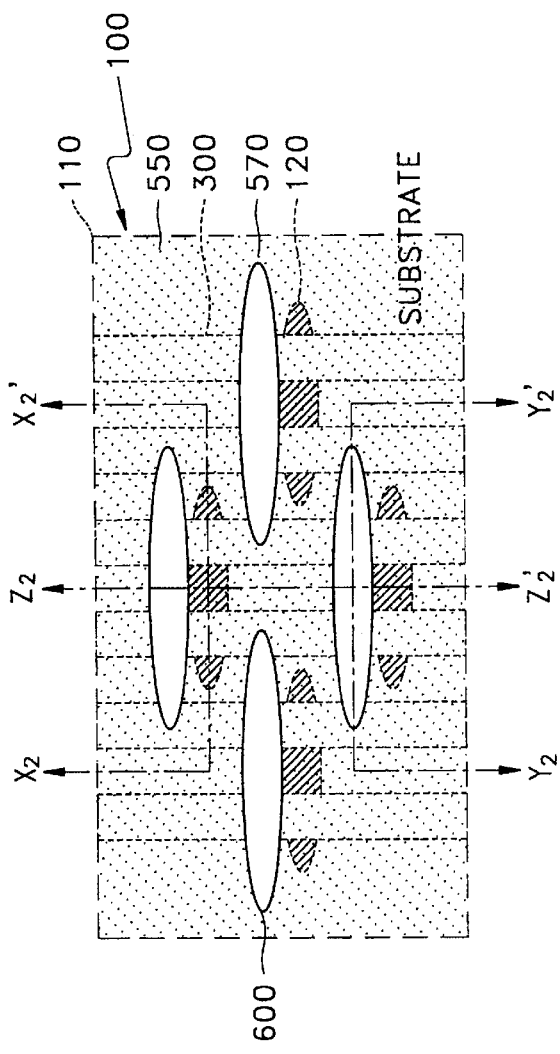
Figure 2B:
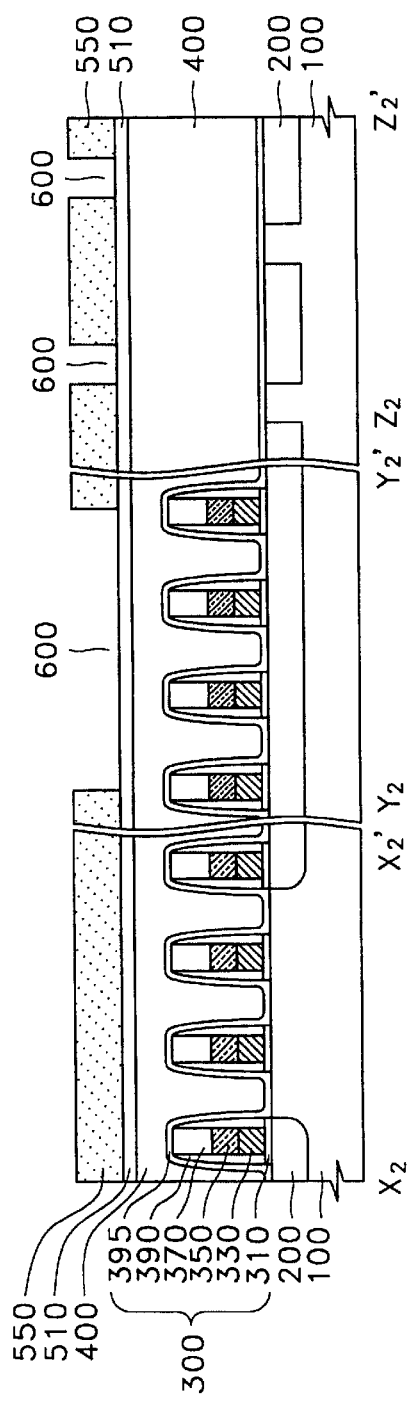

FIG. 2A is a plan view schematically illustrating the step of forming a dummy or sacrificial dielectric layer 400 and forming a photoresist pattern 550 on the dummy dielectric layer 400, and FIG. 2B is a sectional view taken along lines $X_2-X_2'$, $Y_2-Y_2'$, and $Z_2-Z_2'$ of FIG. 2A, according to embodiments of the present invention.

Specifically, the dummy dielectric layer 400 for filling gaps between the gate lines 300 is formed on a semiconductor substrate 100. The dummy dielectric layer 400 is formed of an insulating material having a flowability that is high enough so that it can fill the gap between the gate lines 300. Also, the dummy dielectric layer 400 is formed of an insulating material which has a high dry or/and wet etch rate compared to the hard mask 370, the spacer 390 and/or the stopper layer 395, to have a high etch selectivity with them. This can reduce or prevent the spacer 390 and the hard mask 370 from being damaged by the later process of patterning or removing the dummy dielectric layer 400. Thus, the gates 330 and 350 can be prevented from being attacked by the process of patterning or removing the dummy dielectric layer 400. Further, preferably, the dummy dielectric layer 400 is formed of an insulating material having a very high wet or dry etch-rate compared to an insulating material comprising an interdielectric layer to be formed later.

Thus, various insulating materials can be selectively used in forming the dummy dielectric layer 400 depending on the insulating material to be used as the stopper layer 395 and an interdielectric layer to be formed later. However, preferably, the dummy dielectric layer 400 is formed of insulating materials having a very high wet or dry etching selectivity ratio at least with respect to an insulating material to be used as the stopper layer 395 and an interdielectric layer to be formed later.

For example, the dummy dielectric layer 400 can be formed of silicon dioxide ($SiO_2$) having adequate flowability characteristics, such as flowable oxide (FOX; manufactured by Dow Corning) or hydrosilsesquioxane (HSQ). The FOX layer or the HSQ layer is formed to cover the gate lines 300 by a coating method such as a spin-on method. Besides these layers, since a layer coated on by the spin-on method, for example, spin-on-glass (SOG) insulating material, has a high etch-rate compared to conventional silicon dioxide ($SiO_2$), the layer can be used for the dummy dielectric layer 400.

Conventional silicon dioxide ($SiO_2$) refers to a silicon dioxide formed by a method other than coating, for example, a high density plasma-CVD (HDP-CVD) silicon dioxide ($SiO_2$) method or a CVD-silicon dioxide ($SiO_2$) method. Also, conventional silicon dioxide ($SiO_2$) refers to silicon dioxide ($SiO_2$) such as borophosphosilicate glass (BPSG) or tetraethylorthosilicate (TEOS).

It is known that conventional silicon dioxide ($SiO_2$) has a very low wet etch-rate compared to FOX and HSQ. For example, HDP-CVD silicon dioxide ($SiO_2$) has a low wet etch-rate of about $1/100$ or less for a diluted hydrofluoric acid (HF) solution, compared to FOX. The high wet etch-rate of the FOX layer may result from the FOX layer having a very low density compared to the conventional silicon dioxide ($SiO_2$) layer.

Since the dummy dielectric layer 400 will be selectively removed by the wet or dry etching as described below, besides the layer of silicon dioxide ($SiO_2$) formed by coating as described above, the dummy dielectric layer 400 can be formed of insulating materials having a high dry etch-rate such as organic materials comprised of polymer. That is, in general, the organic materials such as polymer have a very high dry etch-rate compared to inorganic materials having such as silicon dioxide ($SiO_2$). Here, the dry etch-rate means an etch rate in an isotropic dry etch rate such as ashing rather than an etch rate in a conventional anisotropic dry etch rate.

For example, organic materials such as resist materials used in a photo-process can be used as the dummy dielectric layer 400. Organic materials used as an organic antireflective layer (ARL) in a photolithographic process can also be used as the dummy dielectric layer 400. Meanwhile, FLARE (manufactured by Allied Signal Advanced Microelectronic Materials) and SiLK can be used as organic insulating materials. The organic materials can be removed at a high etch-rate by ashing and/or by dry etching using oxygen as a source gas.

As described above, the dummy dielectric layer 400 comprised of HSQ or FOX has a comparatively flat surface owing to adequate flowability of HSQ or FOX. Thus, a photoresist layer is formed on the dummy dielectric layer 400 having a flat surface and the photoresist layer is exposed and developed. Then, a photoresist pattern 550 exposing other portions except for a portion in which a contact body (not shown) is located in a cell region 110, is formed. In order to form the small photoresist pattern 550, an antireflective layer (ARL) 510 can be further formed beneath the photoresist layer.

The exposed portion 600 of the dummy dielectric layer 400, in which the contact body is not formed, can correspond to an isolation region 200 between active regions 120. Since the active regions 120 can be formed in the shape of (–)-type or t-type arrangement, the portion 600 to be exposed by the photoresist pattern 550 can be set in long oval-type or (–)-type for exposing the active regions 120. Thus, the photoresist pattern 550 is shielded by covering the portion on which the contact body is substantially formed.

A protection liner (not shown) having a dense structure compared to the dummy dielectric layer 400 can be introduced beneath the antireflective layer (ARL) 510. The protection liner is introduced to reduce or prevent the dummy dielectric layer 400 from being damaged in a development process for forming the photoresist pattern 550. Thus, the protection liner can be formed of a silicon oxide layer formed by a CVD process such as PE-CVD, AP-CVD, and HDP-CVD.

Figure 3A:
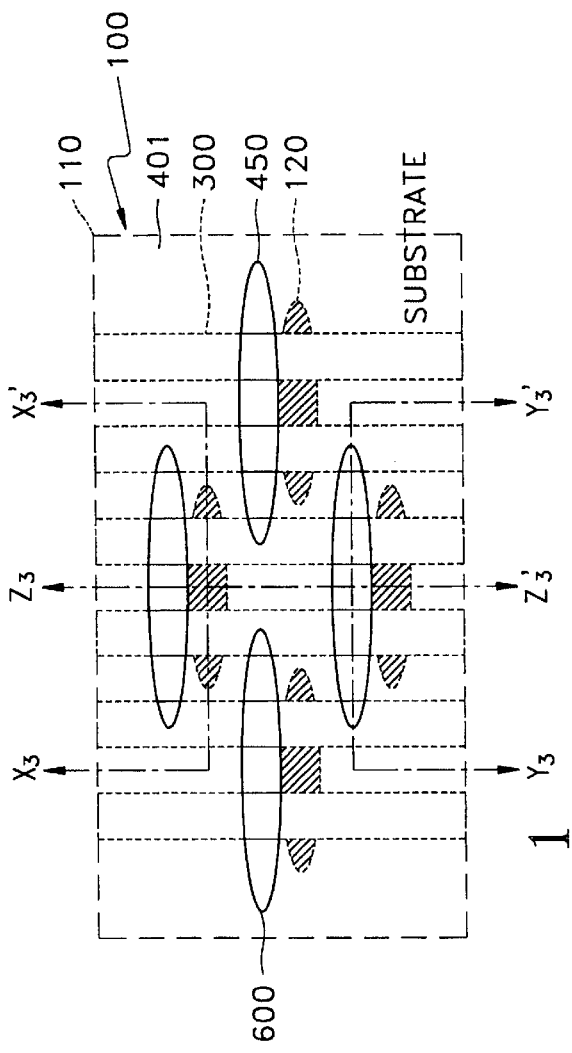
Figure 3B:
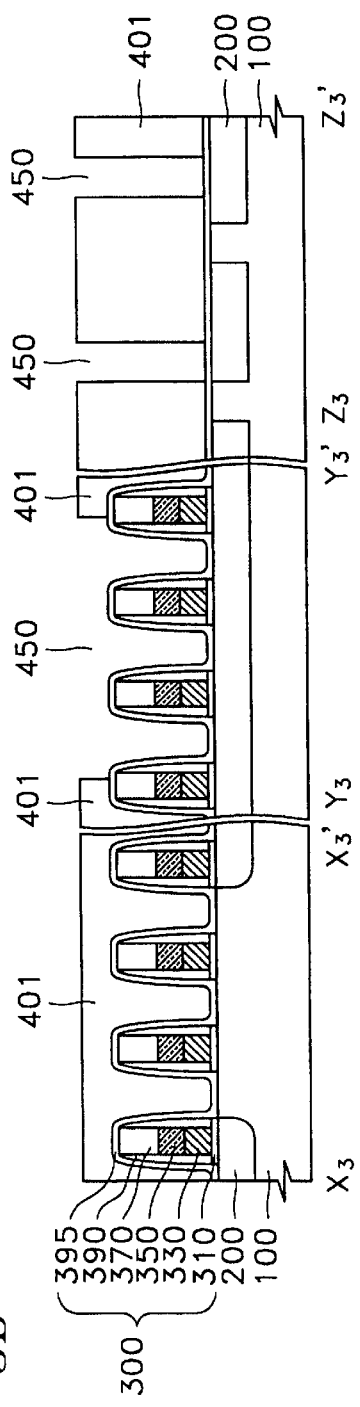

FIG. 3A is a plan view schematically illustrating the step of forming a dummy dielectric layer pattern 401 having a dummy opening 450, for patterning the dummy dielectric layer 400, and FIG. 3B is a sectional view taken along lines $X_3-X_3'$, $Y_3-Y_3'$, and $Z_3-Z_3'$ of FIG. 3A, according to embodiments of the present invention.

In detail, the dummy dielectric layer 400 is selectively etched using the photoresist pattern 550 as an etching mask, and a dummy dielectric layer pattern 401 having a dummy opening 450 for exposing the gap portion between gate lines 300 is formed. Here, an etching process forming the dummy opening 450 can be performed by a selective dry etching, and the etching can be stopped on the stopper layer 395. The dummy opening 450 exposes the gap portion between the gate lines 300 on a portion on which a contact body will be not formed.

Where the dummy dielectric layer 400 is formed of organic materials, a patterning process for forming the dummy dielectric layer pattern 401 can be performed using a dry etching process using oxygen and/or an ashing process using an additional etching mask (not shown). Also, where the dummy dielectric layer 400 is formed using FLARE, the patterning process can be performed using dry etching with an etching gas containing nitrogen and hydrogen gas. Since the photoresist pattern 550 and FLARE of the dummy dielectric layer 400 has an etching selectivity in the dry etching, the additional etching mask can be omitted.

Preferably, the dummy opening 450 is formed to intersect the lower gate lines 300. Thus, a plurality of gate lines 300 can be exposed by the dummy opening 450. Therefore, a photo-process having a very high resolution is not necessary, and a large margin of the photo-process can be obtained.

Figure 4A:
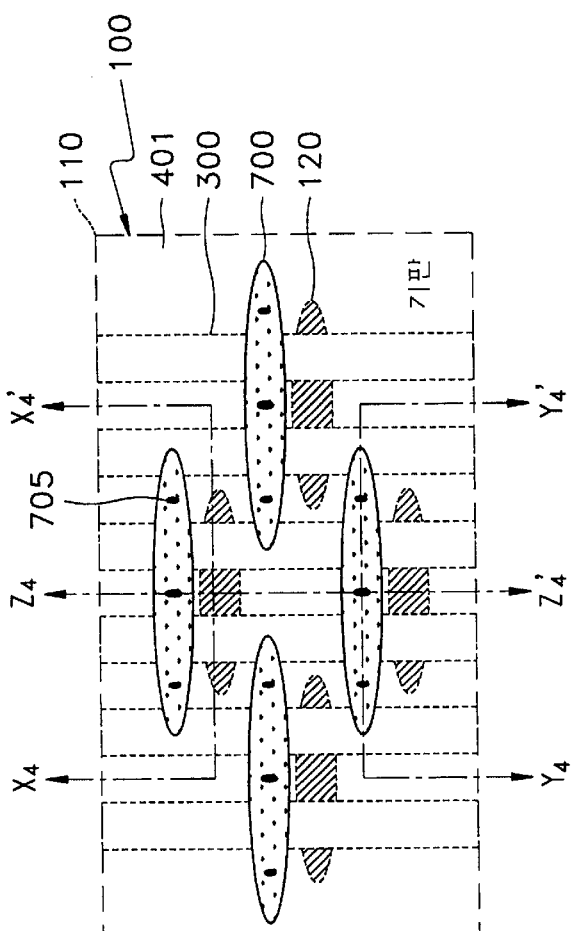
Figure 4B:
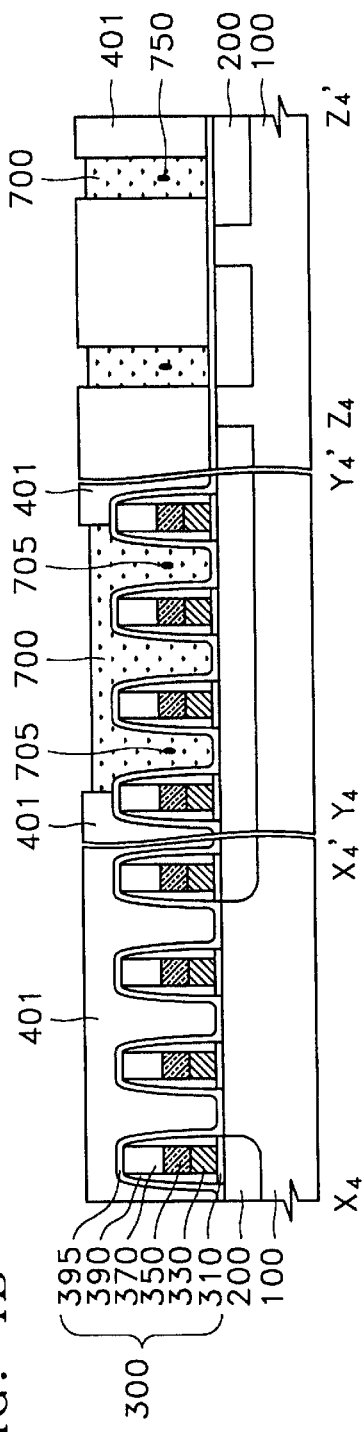

FIG. 4A is a plan view schematically illustrating the step of forming an interdielectric layer pattern 700 for filling a dummy opening 450, and FIG. 4B is a sectional view taken along lines $X_4$–$X_4'$, $Y_4$–$Y_4'$, and $Z_4$–$Z_4'$ of FIG. 4A, according to embodiments of the present invention.

Specifically, an interdielectric layer for filling the dummy opening 450 is formed. The interdielectric layer is defined in the dummy opening 450 by a chemical mechanical polishing (CMP) or dry etch-back process A wet etch-back process can be used in etching the interdielectric layer. The polishing or etching back is performed so that the surface of a dummy dielectric layer pattern 401 may be exposed, and then an interdielectric layer pattern 700 is formed.

Preferably, the interdielectric layer is formed of insulating materials having a very low wet or dry etch-rate compared to the dummy dielectric layer pattern 401. For example, as described above, in a case where the dummy dielectric layer pattern 401 is formed of silicon dioxide ($SiO_2$) such as FOX or HSQ by coating, the interdielectric layer pattern 700 can be formed of CVD-silicon dioxide ($SiO_2$) having a relatively low wet etch-rate that may result from high density compared to the materials such as FOX or HSQ. For example, the interdielectric layer pattern 700 can be formed of conventional silicate glass series such as BPSG or silicon dioxide ($SiO_2$) and/or of TEOS formed by CVD methods such as HDP-CVD, AP-CVD and/or PECVD.

The interdielectric layer pattern 700 can be formed of silicon nitride ($Si_3N_4$) when the dummy interdielectric layer pattern 401 is formed of the conventional silicon dioxide ($SiO_2$). Since silicon nitride ($Si_3N_4$) generally possesses a very low wet etch-rate compared to silicon dioxide ($SiO_2$), the above combination is possible. Also, the interdielectric layer pattern 700 can be formed of silicon oxynitride (SiON), silicon carbide (SiC) and/or aluminum oxide ($Al_2O_3$) having a very low wet etch-rate compared to silicon dioxide ($SiO_2$).

The dummy dielectric layer pattern 401 can be formed of a material such as FOX, and the interdielectric layer pattern 700 can be formed of insulating materials of SOG such as TOSZ (manufactured by Tonnen). Where the interdielectric layer pattern 700 is formed of TOSZ, the step of wet annealing and densifying TOSZ after depositing TOSZ may be performed. The insulating materials such as FOX forming the dummy dielectric layer pattern 401 may be somewhat densified during wet annealing. Since this may be harmful, in order to prevent the FOX of the dummy dielectric layer pattern 401 from being affected by wet annealing, a reaction-preventive layer such as silicon nitride ($Si_3N_4$) may be further formed before depositing TOSZ. The reaction-preventive layer prevents diffusion or penetration into the dummy dielectric layer pattern 401 of oxygen during wet annealing, and then the reaction-preventive layer prevents the FOX forming the dummy dielectric layer pattern 401 from being densified.

As a consequence, the dummy dielectric layer pattern 401 may be formed of insulating materials having a very high wet (or, according to circumstance, dry) etch-rate compared to the interdielectric layer pattern 700. The interdielectric layer pattern 700 may be formed of insulating materials having a high wet (or dry) etching selectivity for the dummy dielectric layer pattern 401 owing to a low wet (or, according to circumstances, dry) etch-rate compared to the dummy dielectric layer pattern 401.

Since the interdielectric layer pattern 700 fills the gaps between the gate lines 300, the aspect ratio of the gaps can be very high so that a seam or void 705 can occur in the gaps. Although the void 705 can be formed in the center of the interdielectric layer pattern 700, the void is closed and isolated by insulating materials forming the interdielectric layer pattern 700. That is, the interdielectric layer pattern 700 grows from the inside wall and bottom of the opening 450 due to the deposition characteristics of CVD, and then the void 705 may occur in the center of the interdielectric layer pattern 700 between the gate lines 300. Thus, the void 705 is not extended to the outside of the interdielectric layer pattern 700 to be exposed to the lateral direction. As a result, although a conductive material may remain in the void 705 or a seam in a later process of depositing a conductive material, it is possible to prevent the residual conductive material from acting as defect that causes an electrical short-circuit such as a bridge.

Figure 5A:
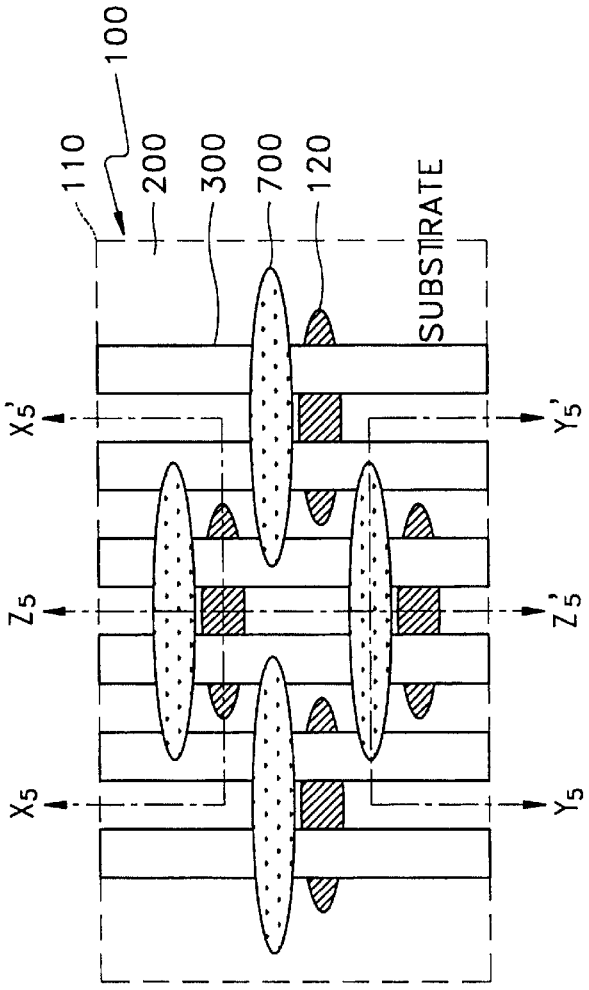
Figure 5B:
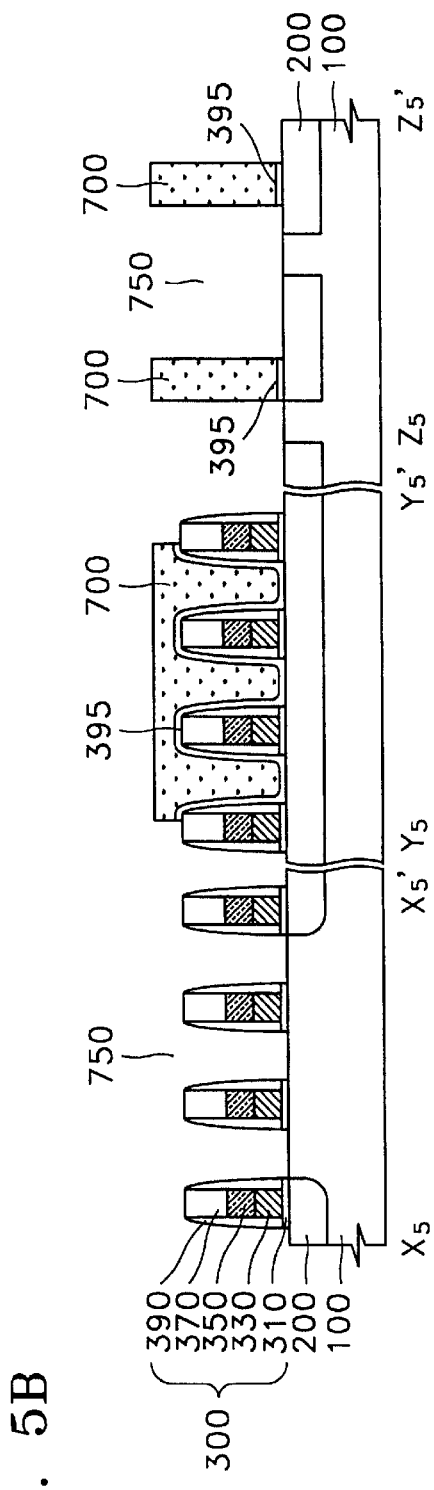

FIG. 5A is a plan view schematically illustrating the step of selectively removing a dummy dielectric layer pattern 401, and FIG. 5B is a sectional view taken along line $X_5$–$X_5'$, $Y_5$–$Y_5'$, and $Z_5$–$Z_5'$ of FIG. 5A, according to embodiments of the present invention.

In detail, a contact opening 750 is formed by selectively removing a dummy dielectric layer pattern 401 using an interdielectric layer pattern 700 as an etching mask. Thus, the contact opening 750 is located in a portion in which the dummy dielectric layer pattern 401 is located. Since the conventional problems of the SAC process may mainly occur in a cell region 110, a cell open process for selectively exposing the cell region 110 can be performed. For example, the cell open process can form an additional second photoresist pattern (not shown) or an etching mask (not shown) for selectively exposing the cell region 110 on the structure in which the interdielectric layer pattern 700 and the dummy dielectric layer pattern 401 are formed, before the process of selectively removing the dummy dielectric layer pattern 401. The second photoresist pattern or the etching mask shields a peripheral region or a core region except the cell region 110, and then the dummy dielectric layer pattern in the peripheral region or the core region remains even after the step of removing the dummy dielectric layer pattern 401.

The removal of the dummy dielectric layer pattern 401 is performed by wet etching using a wet etchant. The wet etching is performed by selective etching using the difference in a wet etch-rate between the dummy dielectric layer pattern 401 and the interdielectric layer pattern 700. An etchant used in a conventional wet etching process can be used as the wet etchant. For example, a diluted hydrofluoric acid (HF) solution or a buffered oxide etchant (BOE) solution for silicon dioxide ($SiO_2$) can be used as the etchant.

The HSQ or FOX forming the dummy dielectric layer pattern 401 has a very high wet etching rate compared to a conventional silicon dioxide ($SiO_2$) forming the interdielectric layer pattern 700. For example, the interdielectric layer pattern 700 comprised of CVD-silicon dioxide ($SiO_2$) has a low wet etch-rate of about 1:100 or less, for a wet etchant containing the HF solution compared to the dummy dielectric layer pattern 401 comprised of FOX. In this way, the dummy dielectric layer pattern 401 and the interdielectric layer pattern 700 have a high wet etching selectivity of about 100:1, so that the dummy dielectric layer pattern 401 is selectively removed by wet etching.

As described above, in a case where the interdielectric layer pattern 700 is formed of SOG such as compacted TOSZ by wet annealing, FOX forming the dummy dielectric layer pattern 401 is selectively removed while realizing a very high etching selectivity in the wet etching.

The wet etching for removing the dummy dielectric layer pattern 401 may be performed until the dummy dielectric layer pattern 401 is completely removed. That is, the wet etching is performed by using a lower stopper layer 395 as an etch stopper. As described above, since the stopper layer 395 is formed of silicon nitride ($Si_3N_4$), the stopper layer 395 possesses a very low wet etch-rate compared to the dummy dielectric layer pattern 401, so that the stopper layer 395 can be used as an etch stopper or etching end.

Thus, damage to a lower spacer 390 and a hard mask 370 during wet etching can be reduced or prevented. As described above, in a case where the spacer 395 and the hard mask 370 are formed of silicon nitride ($Si_3N_4$), the dummy dielectric layer pattern 401 is removed at a very high etching selectivity compared to the spacer 395 and the hard mask 370, so that damage to the spacer 395 and the hard mask 370 can be reduced or prevented. Further, since the damages caused by dry etching in the conventional SAC process do not occur, damage to the spacer 395 and the hard mask 370 can be more reliably prevented.

After the dummy dielectric layer pattern 401 is selectively removed by wet etching, the contact opening 750 for exposing a region of the lower semiconductor substrate 100 adjacent to the spacer 395 of the gates 330 and 350 is formed by additionally removing the exposed stopper layer 395. The semiconductor substrate 100 includes an active region 120 and a portion of the active region to which a contact body to be later formed is electrically connected.

The contact opening 750 is formed to expose a plurality of gate lines 300 and the region of the semiconductor substrate 100 adjacent to the gate lines 300. In contrast, a contact hole formed in the conventional SAC process may selectively expose only a specific portion of the semiconductor substrate between gate lines.

Where the dummy dielectric layer pattern 401 is formed of organic materials, the dummy dielectric layer pattern 401 can be removed for the interdielectric layer pattern 700 comprised of inorganic materials such as silicon dioxide ($SiO_2$) by dry etching and/or ashing using oxygen source. Also, where the dummy dielectric layer pattern 401 is formed of FLARE, the selective removing process can be performed by a dry etching process using an etching gas containing nitrogen gas and hydrogen gas.

Additionally, voids (705 of FIG. 4B) occurring in the interdielectric layer pattern 700 are not extended or exposed on the sidewalls of the interdielectric layer pattern 700 forming the sidewalls of the contact opening 750. This may be attributed to the preceding deposition characteristics of the interdielectric layer pattern 700.

Figure 6A:
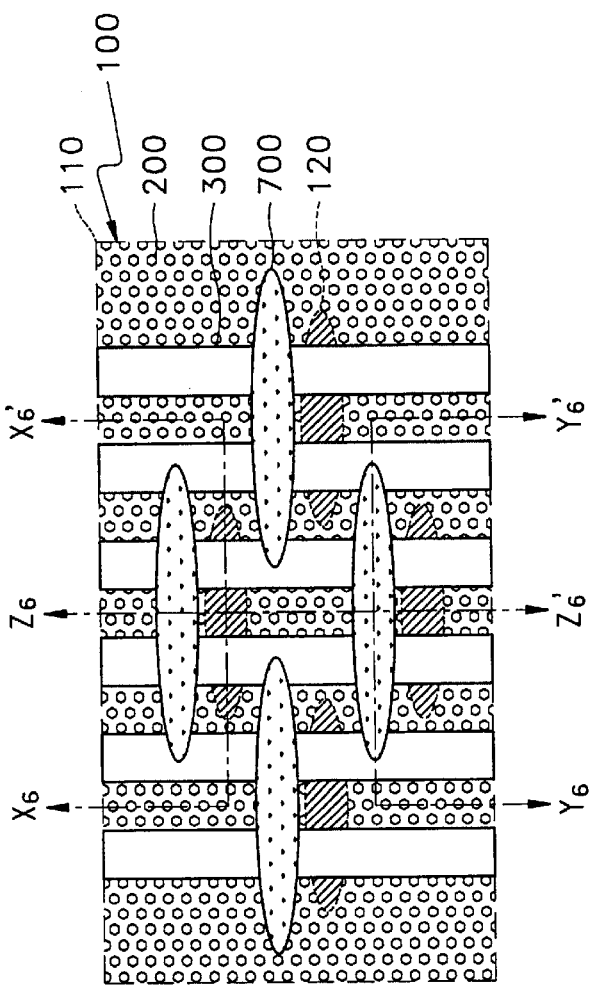
Figure 6B:
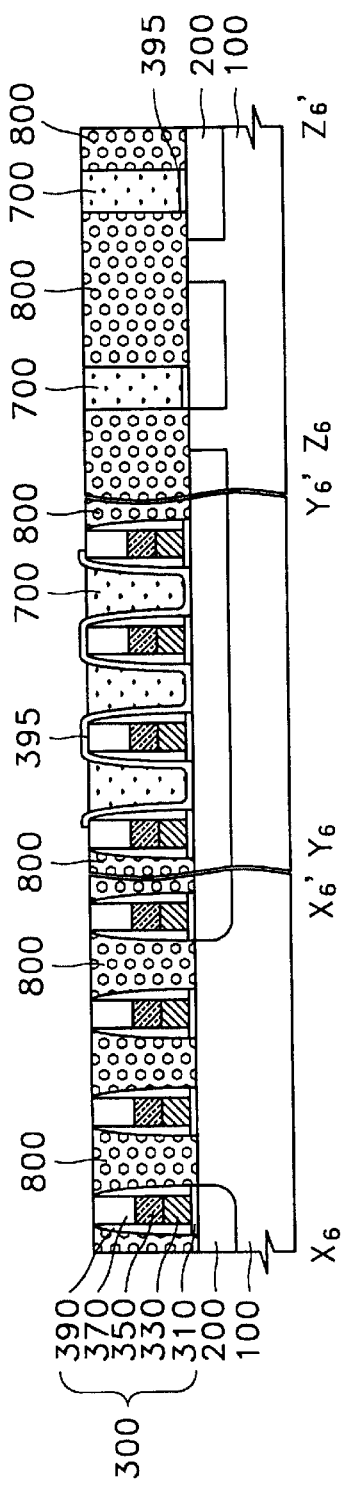

FIG. 6A is a plan view schematically illustrating the step of forming a conductive contact body 800 electrically connected to a semiconductor substrate 100 exposed by a contact opening 750, and FIG. 6B is a sectional view taken along line $X_6$–$X_6'$, $Y_6$–$Y_6'$, and $Z_6$–$Z_6'$ of FIG. 6A, according to embodiments of the present invention.

Specifically, after depositing a conductive layer which fills the formed contact opening 700 and is electrically connected to the exposed semiconductor substrate 100, the surface of the conductive layer is polished by CMP and/or etched back, and the conductive layer is separated in the gap between gate lines 300. Then, the conductive contact body 800 is formed. As a result, two opposite sidewalls of the conductive contact body 800 are separated by a spacer 390 of the gates 330 and 350, or another two opposite sidewalls are separated by an interdielectric layer pattern 700.

The conductive layer can be formed of conventional conductors such as polycrystalline silicon, tungsten (W), titanium (Ti), titanium nitride (TiN), tungsten silicide (WSi), platinum (Pt), aluminum (Al) and/or copper (Cu). The CMP or etching back can be ended by the stopper layer 395 or the hard mask 370 on the stopper layer 395. Here, since a seam or void (750 of FIG. 4A) in the center of the interdielectric layer 700 is not exposed or extended to the side of the contact opening 750, defects such as short-circuits between the conductive contact bodies 800 such as bridges, which occur due to conductive materials filled in the conventional seam or void when depositing the conductive layer, may not occur.

According to embodiments of the present invention, the dummy dielectric layer pattern 401 can be selectively removed by using the interdielectric layer 700 filled in the contact opening 450 as an etching mask, using a wet etching selectivity. The selective etching process is used to realize a high wet etching selectivity, so that damage to the spacer 390 of the gates 330 and 350 and the hard mask 370 or the lower gates 330 and 350 can be reduced or prevented. Further, although the exposed portion of the spacer 390 or the hard mask 370 may be damaged by the process of forming the dummy opening 450, the exposed portion can be shielded by the following interdielectric layer 700, so that electrical short-circuits can be reduced or prevented.

Since a process for forming a contact hole using a high aspect ratio as in the conventional SAC process may not be needed in embodiments of the present invention, it may not be necessary to use a dry etching process in which the critical dimension on the bottom of the contact hole may be difficult to obtain. Also, a photo-process requiring a high resolution may not be necessary.

In embodiments of the invention, in order to realize a high wet etching selectivity between a dummy dielectric layer pattern 401 and an interdielectric layer pattern 700, the dummy dielectric layer pattern 401 is formed of insulating materials having a high wet etch-rate as like silicon dioxide ($SiO_2$) formed by a coating method such as FOX or HSQ, and the interdielectric layer pattern 700 is formed of conventional silicon dioxide ($SiO_2$), for example, silicon dioxide ($SiO_2$) formed by CVD. However, embodiments of the present invention are not limited to such materials.

Although the dummy dielectric layer pattern 401 may be formed of the conventional silicon dioxide ($SiO_2$), in a case where the interdielectric layer pattern 700 is formed of insulating materials having a high wet etching selectivity such as silicon nitride ($Si_3N_4$), effects of embodiments of the present invention also can be realized.

When the interdielectric layer pattern 700 is formed of silicon nitride ($Si_3N_4$), and the dummy dielectric layer pattern 401 is formed of conventional silicon dioxide ($SiO_2$), a process of removing the dummy dielectric layer pattern 401 can be selectively performed in a cell region 110. As a result, the dummy dielectric layer selectively remains on regions except the cell region 110, for example, a core region or a peripheral region, and the residual dummy dielectric layer can be used as a dielectric layer of a semiconductor device. Thus, the dummy dielectric layer need not be entirely removed.

A wet etchant for etching the conventional silicon dioxide ($SiO_2$), for example, BOE or HF solution, may have a very low wet etch-rate with respect to silicon nitride ($Si_3N_4$). Thus, the dummy dielectric layer pattern 401 can be selectively removed at a very high etching selectivity by wet etching using the wet etchant.

Where the interdielectric layer pattern 700 is formed of silicon nitride ($Si_3N_4$), even if the stopper layer 395, the hard mask 370 or the spacer 390 are damaged by a dry etching process of forming the dummy opening 450, the damage can be compensated by silicon nitride ($Si_3N_4$) of the interdielectric layer pattern 700 for filling the dummy opening 450.

In the embodiments described above, the conductive contact body 800 for filling a gap between the gates 330 and 350, for example, a DC pad or BC pad is formed, but embodiments of the present invention can be applied to various contact bodies, for example, a storage node pad of a capacitor or a conductive plug. Other embodiments of the present invention now will be described in detail.

Figure 7:
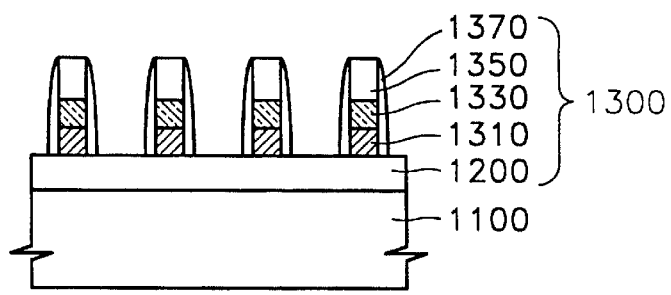
FIGS. 7 through 18 are sectional views illustrating other embodiments of the present invention.
Figure 8:
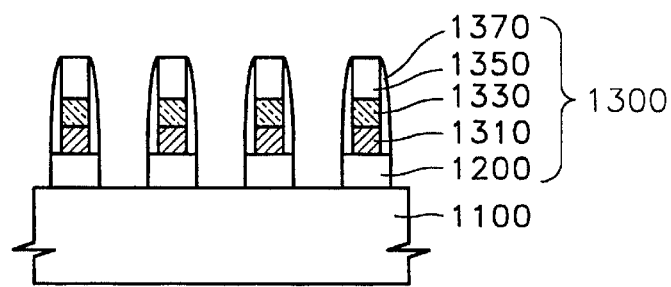
Figure 9:
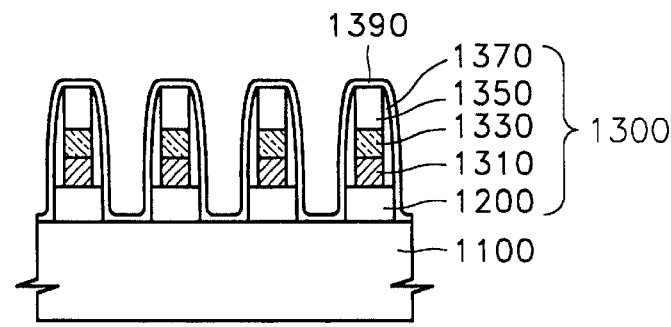
Figure 10:
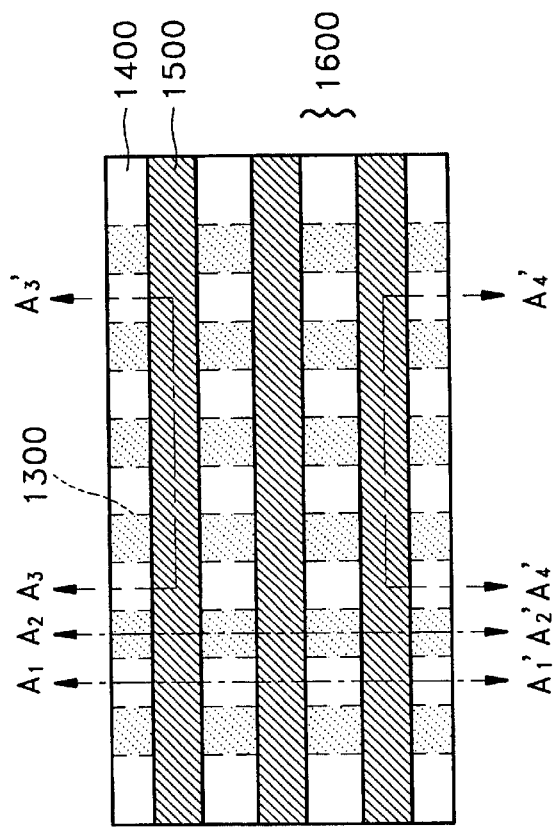
Figure 11:
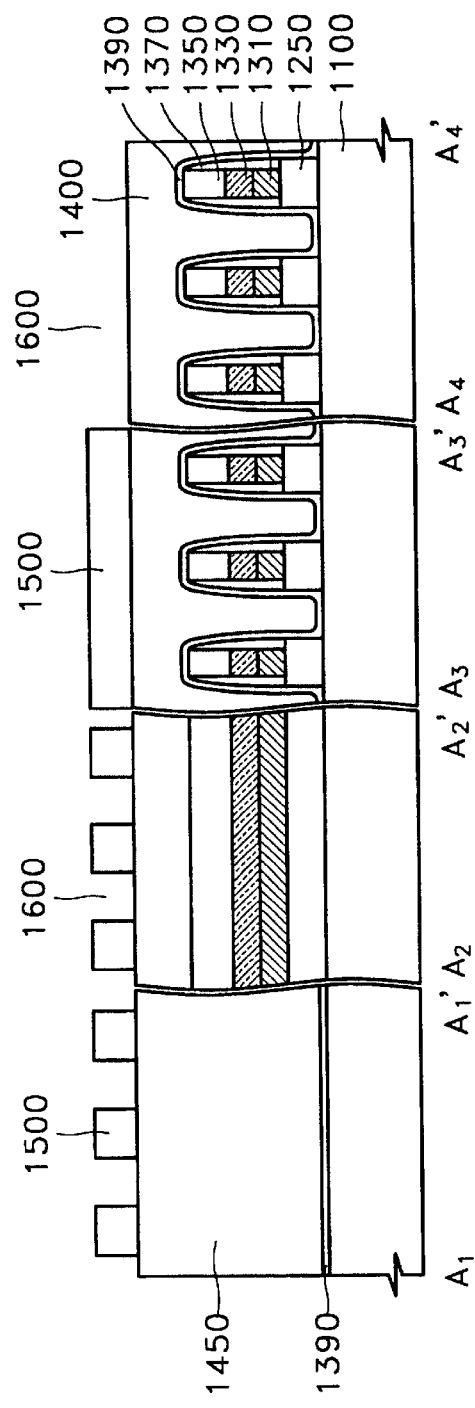

FIGS. 7 through 9 are plan views schematically illustrating a method for forming a dummy dielectric layer for filling conductive lines according to other embodiments of the present invention, FIG. 10 is a plan view schematically illustrating the step of forming a photoresist pattern on the dummy dielectric layer according to the other embodiments of the present invention, and FIG. 11 is a sectional view taken along line $A_1$–$A_1'$, $A_2$–$A_2'$, $A_3$–$A_3'$, and $A_4$–$A_4'$ of FIG. 10. FIGS. 12 through 18 are sectional views taken along line $A_1$–$A_1'$, $A_2$–$A_2'$, $A_3$–$A_3'$, and $A_4$–$A_4'$ of FIG. 10 illustrating a method for forming a conductive contact body according to the other embodiments of the present invention.

FIG. 7 schematically illustrates the step of forming bit line patterns 1310 and 1330 on a semiconductor substrate 1100, according to other embodiments of the present invention.

In detail, a lower dielectric layer 1200 is formed on a semiconductor substrate 1100. A transistor structure (not shown) containing gate lines may be formed on the semiconductor substrate 1100. The lower dielectric layer 1200 can be formed of conventional insulating materials, for example, silicon dioxide ($SiO_2$).

After that, the bit line patterns 1310 and 1330 comprised of a barrier layer 1310 and a conductive pattern 1330 on the lower dielectric layer 1200 are formed by a conventional process. A double layer of titanium (Ti)/titanium nitride (TiN) can be used as the barrier layer 1310. The conductive pattern 1330 is formed of conductive materials such as tungsten (W). Next, a hard mask 1350 for protecting the top of the bit line patterns 1310 and 1330 and a spacer 1370 for protecting the sidewalls of the bit line patterns 1310 and 1330 are formed. Preferably, the hard mask 1350 and the spacer 1370 are formed of silicon nitride ($Si_3N_4$). However, the hard mask 1350 and the spacer 1370 can be formed of insulating materials such as silicon dioxide ($SiO_2$), silicon oxynitride (SiON), silicon carbide (SiC) and/or aluminum oxide ($Al_2O_3$).

FIG. 8 schematically illustrates the step of selectively patterning a lower dielectric layer 1200 exposed by a spacer 1370, according to embodiments of the invention.

Specifically, the exposed lower dielectric layer 1200 is selectively etched by using the spacer 1370 and a hard mask 1350 as an etching mask. A lower semiconductor substrate 1100 is exposed by the etching. In these embodiments of the present invention, the semiconductor substrate 1100 is exposed, but another conductive pad (not shown) exists beneath the lower dielectric layer 1200, and then that conductive pad can be selectively exposed by the etching.

FIG. 9 schematically illustrates the step of forming a stopper layer 1390 for covering a hard mask 1350 and a spacer 1370, according to other embodiments of the invention.

Specifically, a stopper layer 1390 for covering the resultant structure is formed of insulating materials having a low dry etch-rate or wet etch-rate. Since the stopper layer 1390 is a layer used as an etch stopper in the following process, preferably, the stopper layer 1390 is formed of insulating materials having a low etch-rate so as to have a sufficient etching selectivity. For example, a thin layer is formed by depositing silicon nitride ($Si_3N_4$), and then the thin layer is used as the stopper layer 1390.

Additionally, the stopper layer 1390 can repair damage in a case where the hard mask 1350 and the spacer 1370 are damaged by the etching of the lower dielectric layer 1200.

FIG. 10 is a plan view schematically illustrating the step of forming a photoresist pattern 1500 on a dummy dielectric layer 1400 according to other embodiments of the present invention, and FIG. 11 is a sectional view taken along line $A_1$–$A_1'$, $A_2$–$A_2'$, $A_3$–$A_3'$, and $A_4$–$A_4'$ of FIG. 10. Hereinafter, FIGS. 12 through 18 are sectional views taken along line $A_1$–$A_1'$, $A_2$–$A_2'$, $A_3$–$A_3'$, and $A_4$–$A_4'$ of FIG. 10 illustrating methods for forming a conductive contact body according to other embodiments of the present invention.

Specifically, a dummy dielectric layer 1400 for filling a gap between bit line patterns 1310 and 1330 is formed. The dummy dielectric layer 1400 is formed of insulating materials having a flowability high enough to fill the gap between the bit line patterns 1310 and 1330. The dummy dielectric layer 1400 is also formed of insulating materials having a dry or wet etching selectivity to the hard mask 1350 and the spacer 1370. Further, preferably, the dummy dielectric layer 1400 is formed of insulating materials having a lower wet etch-rate than that of insulating materials to be used as the following interdielectric layer.

Thus, the dummy dielectric layer 1400 can be formed of silicon dioxide ($SiO_2$) having adequate flowability characteristics such as FOX or HSQ. Also, since the dummy dielectric layer 1400 is selectively removed by the following wet etching, the dummy dielectric layer 1400 can be formed of materials having insulation characteristics as organic materials such as polymer except the layer of silicon dioxide ($SiO_2$) formed by coating, as described above.

For example, the dummy dielectric layer 1400 can be formed by coating resist materials used in a photo-process. Organic materials used as an organic antireflective layer (ARL) can also be used as the dummy dielectric layer 1400. Organic insulating materials can include FLARE or SiLK.

A photoresist layer is formed, exposed, and developed on the dummy dielectric layer 1400, and then a photoresist pattern 1500 exposing another portion except a portion in which a contact body will be located, is formed. The exposed portion 1600 of the dummy dielectric layer 1400 on which the contact body is not formed, can be set to intersect the bit lines 1300. Thus, the photoresist pattern 1500 is shielded by covering the portion on which the contact body will be formed.

As described above, where the dummy dielectric layer 1400 is formed of resist materials, organic insulating materials such as an organic antireflective layer (ARL) material or an organic insulator and/or a protection liner (not shown) can be further formed on the dummy dielectric layer 1400. The protection liner protects the dummy dielectric layer 1400 from a process of developing the photoresist pattern 1500.

In this case, the protection liner can be formed of silicon dioxide ($SiO_2$), silicon nitride ($Si_3N_4$), silicon oxynitride (Zion) and/or aluminum oxide ($Al_2O_3$). Since it is generally well known that organic insulating materials are weak against heat, preferably, the process of forming the protection liner is performed by CVD at a low temperature, for example, at 400° C. and below, or by coating or by liquid phase deposition.

Figure 12:
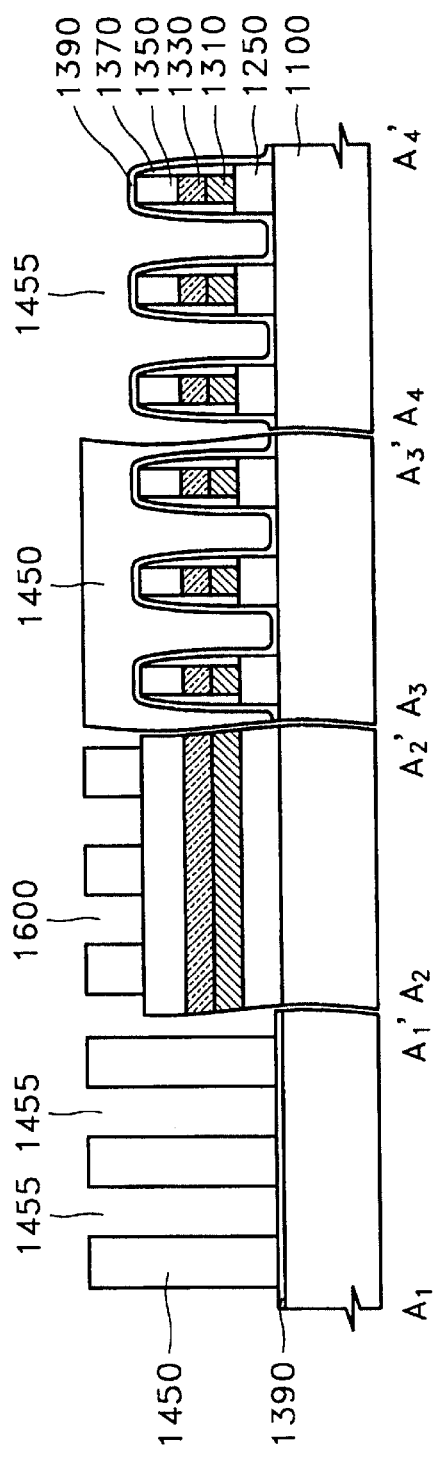

FIG. 12 schematically illustrates the step of forming a dummy dielectric layer pattern 1450 having a dummy opening 1455 for patterning a dummy dielectric layer 1400, according to other embodiments of the presentation.

Specifically, a dummy dielectric layer 1400 is selectively etched by using the photoresist pattern 1500 as an etching mask, and then a dummy dielectric layer pattern 1450 having a dummy opening 1455 for exposing the gap portion between the bit lines 1300 is formed. An etching process for forming the dummy opening 1455 can be performed by a selective dry etching process, and the etching end of the etching process can be performed on insulating materials forming the dummy dielectric layer 1400 and insulating materials having an etching selectivity, for example, on a stopper layer 1390 comprised of silicon nitride ($Si_3N_4$). The dummy opening 1455 exposes the gap portion between the bit lines 1300 on which a contact body will be not formed.

Where the dummy dielectric layer 1400 is formed of organic insulating materials, a dry etching method, in which reaction gas containing nitrogen and hydrogen is used as etchant gas, can be used.

Figure 13:
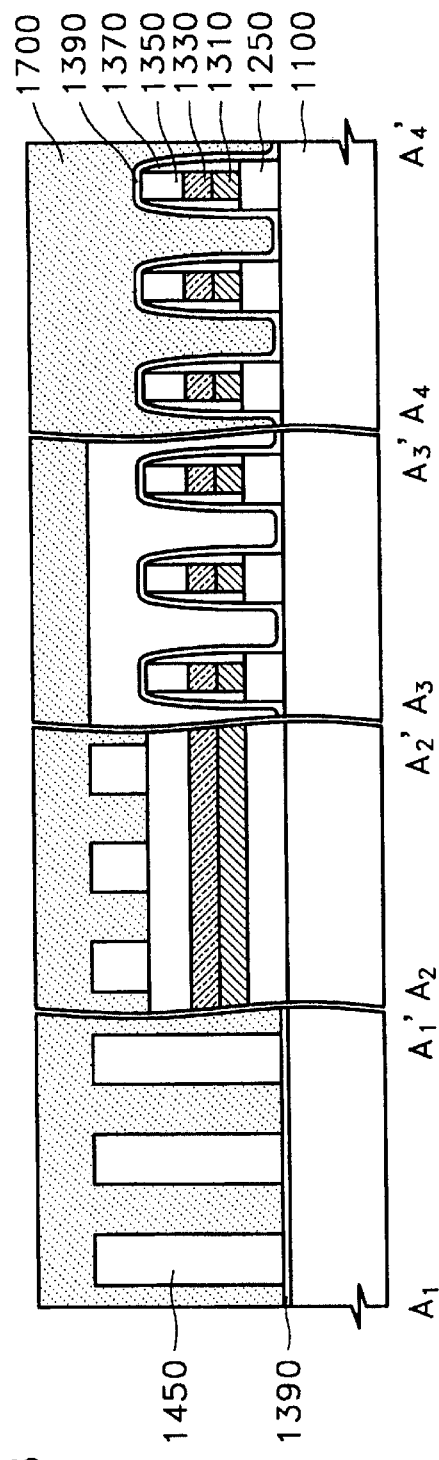

FIG. 13 schematically illustrates the step of forming an interdielectric layer 1700 for filling a dummy opening 1455, according to other embodiments of the invention.

In detail, an interdielectric layer 1700 for filling a dummy opening 1455 is formed. Preferably, the interdielectric layer 1700 is formed of an insulating material having a low dry or wet etch-rate compared to the dummy dielectric layer pattern 1450. For example, as described above, in a case where the dummy dielectric pattern 1450 is formed of silicon dioxide ($SiO_2$) formed by the coating method such as FOX and/or HSQ, the interdielectric layer 1700 can be formed of CVD-silicon dioxide ($SiO_2$) having a relatively low wet etch-rate owing to high density compared to materials such as FOX or HSQ. CVD-silicon dioxide ($SiO_2$) means silicon dioxide ($SiO_2$) formed by using CVD. The interdielectric layer 1700 can be formed of a conventional silicate glass such as BPSG, or the interdielectric layer 1700 can be formed of silicon dioxide ($SiO_2$) formed by a CVD process such as HDP-CVD, AP-CVD and/or PE-CVD. Also, the interdielectric layer 1700 can be formed of insulating materials such as silicon nitride ($Si_3N_4$), silicon carbide (SiC), silicon oxynitride (SiON) and/or aluminum oxide ($Al_2O_3$). Preferably, the interdielectric layer 1700 is formed of silicon nitride ($Si_3N_4$).

Where the dummy dielectric layer pattern 1450 is formed of the preceding organic insulating materials, for example, a resist material, an organic antireflective layer (ARL) material, or an organic insulator, since it is generally known that the organic insulating materials are weak against heat, preferably, the process of forming the interdielectric layer 1700 is performed by CVD at a low temperature, for example, at 400° C. and below, or by coating and/or by liquid phase deposition.

Figure 14:
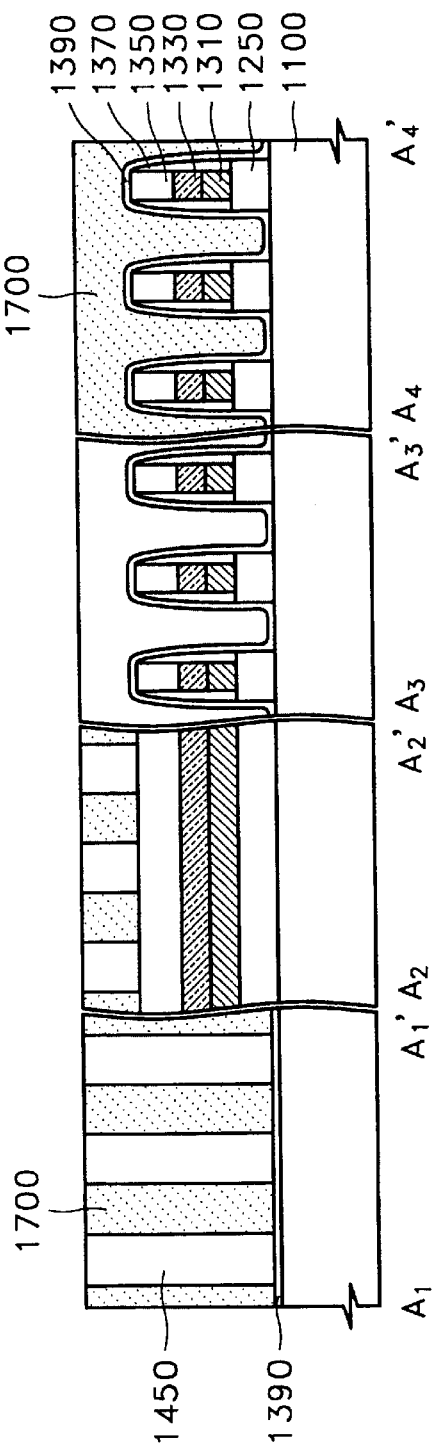

FIG. 14 schematically illustrates the step of exposing a dummy dielectric layer pattern 1450 by polishing or etching an interdielectric layer 1700, according to other embodiments of the present invention.

Specifically, an interdielectric layer 1700 is defined in a dummy opening 1455 by exposing the surface of a lower dummy dielectric layer pattern 1450 by CMP, or dry or wet etch-back of the interdielectric layer 1700.

Figure 15:
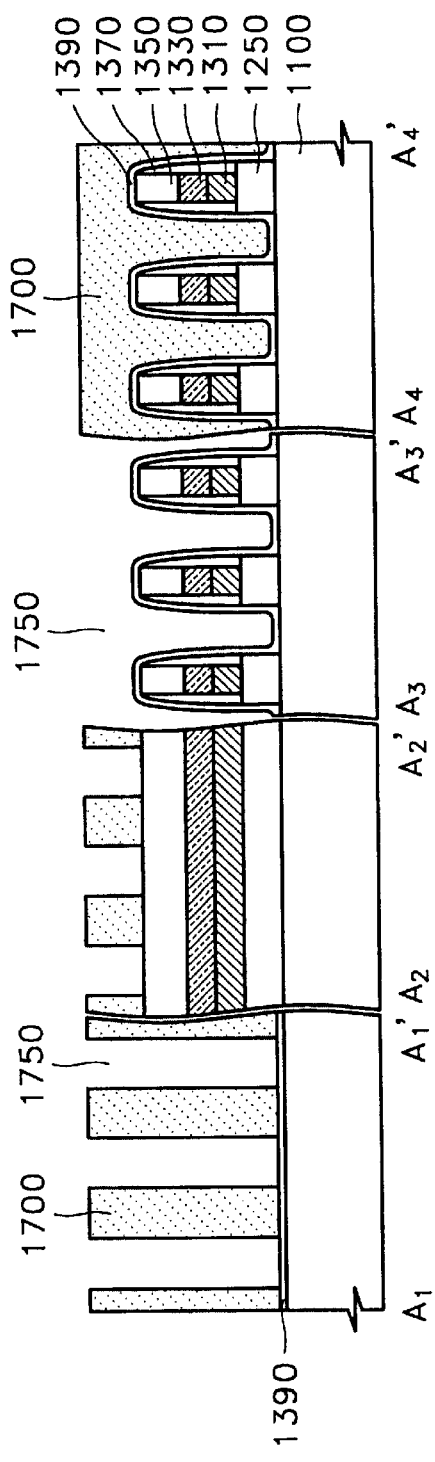

FIG. 15 schematically illustrates the step of selectively removing an exposed dummy dielectric layer pattern 1450, according to other embodiments of the present invention.

Specifically, an exposed dummy dielectric layer pattern 1450 is selectively removed by using an interdielectric layer 1700 as an etching mask, and then a contact opening 1750 is formed. The contact opening 1750 exposes a portion in which the dummy dielectric layer pattern 1450 was located.

The removal of the dummy dielectric layer pattern 1450 is performed by selective wet etching in which a wet etchant is used. The wet etching is performed by a selective etching using the difference in a wet etch-rate between the dummy dielectric layer pattern 1450 and the interdielectric layer 1700. An etchant for conventional silicon dioxide ($SiO_2$), for example, HF and/or BOE solution can be used as the wet etchant.

The FOX forming the dummy dielectric layer pattern 1450 possesses a very high wet etching rate with respect to silicon nitride ($Si_3N_4$) forming the interdielectric layer 1700. Thus, the dummy dielectric layer pattern 1450 can be selectively removed without damage to a lower stopper 1390 or a spacer 1350 and a hard mask 1370.

Where the dummy dielectric layer pattern 1450 is formed of organic materials, the removal of the dummy dielectric layer pattern 1450 can be performed by dry etching using oxygen as a source gas, or an ashing process and/or a dry etching process using nitrogen or hydrogen gas as a reaction gas.

Figure 16:
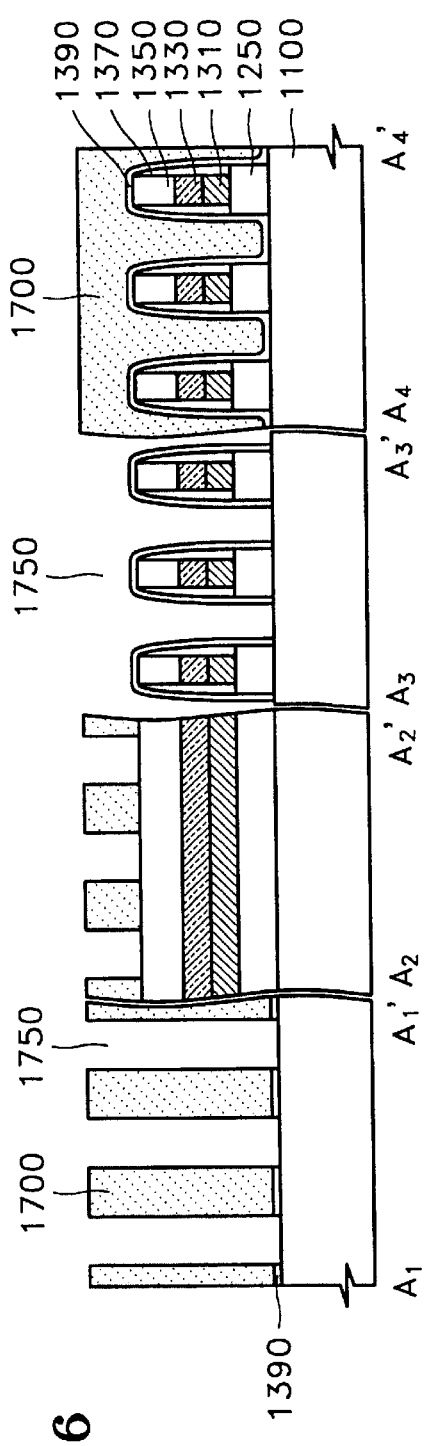

FIG. 16 schematically illustrates the step of removing an exposed stopper layer 1390, according to other embodiments of the present invention.

Specifically, as described above, an exposed stopper layer 1390 is removed after a dummy dielectric layer pattern 1450 is selectively removed by wet (or, according to circumstances, dry) etching, and then a contact opening 1750 for exposing a semiconductor substrate 1100 to which a contact body is connected, is formed. Where a conductive pad (not shown), which is electrically connected to the semiconductor substrate 1100, is introduced on the semiconductor substrate 1100, the surface of the conductive pad is exposed on the contact opening 1750 by the removal of the stopper layer 1390.

Figure 17:
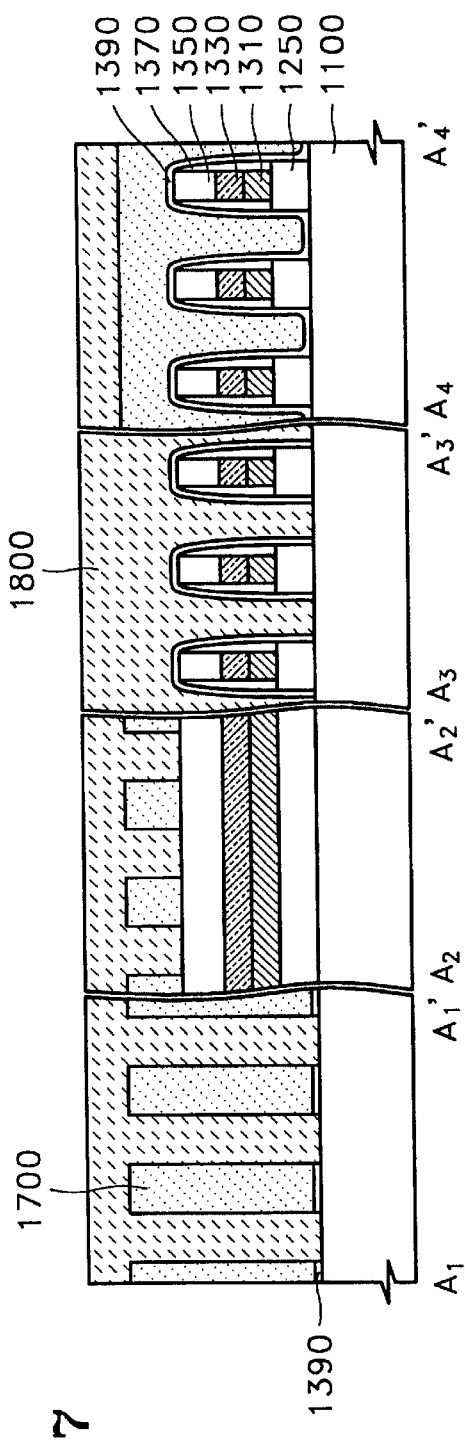

FIG. 17 schematically illustrates the step of forming a conductive layer 1800 for filling a contact opening 1750, according to other embodiments of the present invention.

Specifically, a conductive layer 1800, which is electrically connected to a semiconductor substrate 1100 by filling a formed contact opening 1750, is deposited. The conductive layer 1800 can be formed of polycrystalline silicon, tungsten (W), titanium (Ti), titanium nitride (TiN), tungsten silicide (WSi), platinum (Pt), aluminum (Al) and/or copper (Cu).

Figure 18:
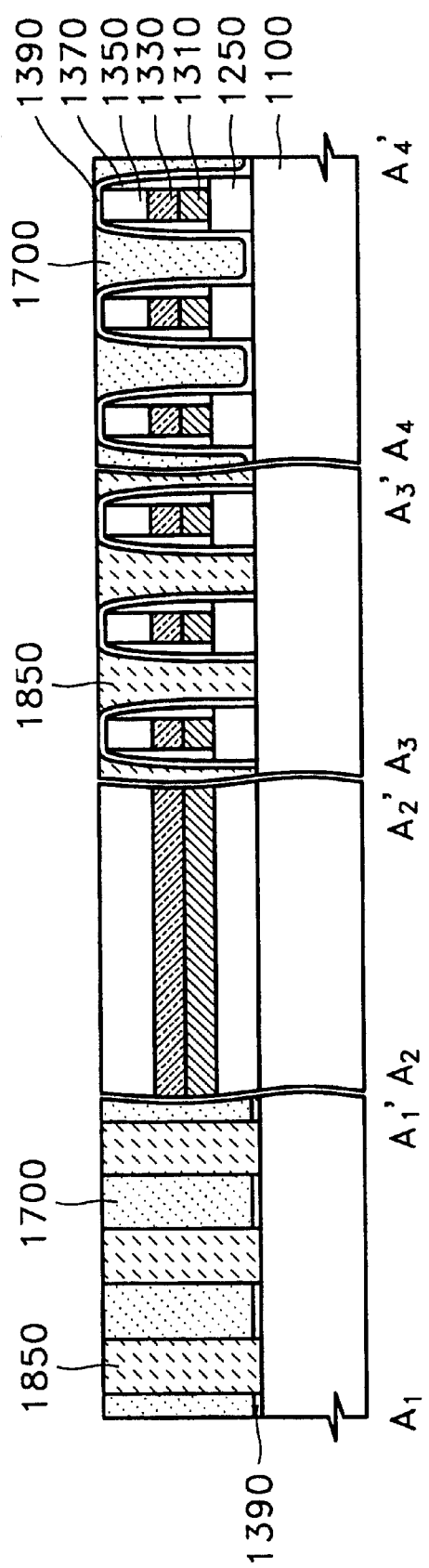

FIG. 18 schematically illustrates the step of forming a contact body 1850 by etching or polishing a conductive layer 1800, according to other embodiments of the present invention.

Specifically, the surface of a conductive layer 1800 is polished or etched by etching back and/or CMP, and the conductive layer 1800 is separated into a conductive contact body 1850. Thus, the etching back or CMP is performed so that a stopper layer 1390 may be exposed, and then the conductive layer 1800 is completely separated into a contact opening 1750, and the conductive contact body 1850 is formed. The conductive contact body 1850 can be used as a storage node pad of a capacitor.

According to embodiments of the present invention, a wet or dry etching process, in which a high etching selectivity between the dummy dielectric pattern and the interdielectric layer pattern is used, can be applied in an etching process to be accompanied by forming the contact body. As a result, the spacer and the hard mask for protecting conductive patterns such as gate or bit line patterns may not be damaged by the dry etching process. Even if the stopper layer or the spacer and the hard mask are damaged by a selective dry etching process used in forming the dummy opening, the dummy opening is filled by the interdielectric layer pattern, and then damage on the stopper layer or the spacer or the hard mask can be compensated by the interdielectric layer pattern. Accordingly, even if damage occurs, the damage can be reduced or cured.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for forming a conductive contact body of an integrated circuit device, comprising:
    forming a plurality of conductive lines including a line-type conductive pattern and a shielding dielectric layer on sides and tops of the conductive pattern, on an integrated circuit substrate;
    forming a dummy dielectric layer in gaps between the conductive lines;
    patterning the dummy dielectric layer to produce a dummy opening that selectively exposes some of the gaps between the conductive lines;
    forming an interdielectric layer pattern in the dummy opening;
    selectively removing the dummy dielectric layer pattern using the interdielectric layer pattern as an etching mask to form a contact opening;
    forming a conductive layer in the contact opening and that is electrically connected to the substrate; and
    etching the conductive layer to separate the conductive layer into conductive contact bodies surrounded by the shielding dielectric layer and the interdielectric layer pattern.

2. The method according to claim 1, wherein the shielding dielectric layer has a lower dry or wet etch-rate than that of the dummy dielectric layer.

3. The method according to claim 2, wherein the shielding dielectric layer comprises at least one of silicon dioxide ($SiO_2$), silicon nitride ($Si_3N_4$), silicon carbide (SiC), silicon oxynitride (SiON) and aluminum oxide ($Al_2O_3$).

4. The method according to claim 1, wherein the shielding dielectric layer includes a hard mask on the tops of the conductive pattern and a spacer on the sides of the conductive pattern.

5. The method according to claim 4, wherein the shielding dielectric layer is further comprised of a stopper layer that covers the spacer, the hard mask and the substrate between the spacers.

6. The method according to claim 5, wherein the stopper layer comprises silicon nitride ($Si_3N_4$).

7. The method according to claim 1, wherein the conductive pattern comprises a gate or a bit line.

8. The method according to claim 7, further comprising the steps of:
    further forming a lower dielectric layer beneath the bit line; and
    etching the lower dielectric layer to expose the substrate.

9. The method according to claim 1, wherein the interdielectric layer pattern comprises at least one of silicon dioxide ($SiO_2$), silicon nitride ($Si_3N_4$), silicon carbide (SiC), silicon oxynitride (SiON) and aluminum oxide ($Al_2O_3$).

10. The method according to claim 1, wherein the dummy dielectric layer is comprised of a silicon oxide layer that is coated on the substrate, and the interdielectric layer is comprised of a silicon oxide layer that is chemical vapor deposited (CVD) on the substrate.

11. The method according to claim 10, wherein the silicon oxide layer that is coated comprises at least one of a flowable oxide (FOX) layer and a hydrosilsesquioxane (HSQ) layer.

12. The method according to claim 1, wherein the dummy dielectric layer is comprised of a flowable oxide (FOX) layer, and the interdielectric layer pattern is comprised of at least one of a silicon oxide layer that is deposited on the substrate by high density plasma-CVD, a borophosphosilicate glass (BPSG) layer and a tetraethylorthosilicate (TEOS) layer.

13. The method according to claim 1, wherein the dummy dielectric layer is comprised of a silicon oxide layer that is deposited on the substrate by CVD, and the interdielectric layer comprises silicon nitride ($Si_3N_4$).

14. The method according to claim 1, wherein the dummy dielectric layer pattern is comprised of a flowable oxide (FOX) layer, and the step of forming an interdielectric layer pattern comprises the steps of:
    forming a reaction-preventing layer on the dummy dielectric layer pattern;
    depositing a silicon dioxide ($SiO_2$) of spin-on glass (SOG) that fills the dummy contact hole on the reaction-preventing layer;
    wet-annealing the silicon oxide ($SiO_2$) and densifying the silicon oxide ($SiO_2$); and
    etching the densified silicon oxide layer to expose the dummy dielectric layer pattern.

15. The method according to claim 1, further comprising the step of forming a protective liner comprising insulating material having a lower etch-rate than that of the dummy dielectric layer, on the dummy dielectric layer.

16. The method according to claim 1, wherein the dummy opening exposes an isolation region of the semiconductor substrate adjacent to the conductive line, and the contact opening exposes an active region of the semiconductor substrate adjacent to the dummy opening.

17. The method according to claim 1, wherein the dummy opening is formed to intersect the conductive line.

18. The method according to claim 1, wherein the contact opening exposes a conductive pad that is electrically connected to the substrate.

19. The method according to claim 1, wherein the step of etching the conductive layer is performed by at least one of a wet etch-back, a dry etch-back and chemical-mechanical polishing.

20. The method according to claim 1, wherein the step of etching the conductive layer is performed by using the shielding dielectric layer on the top of the conductive pattern as an etching end stop.

21. The method according to claim 1, wherein the dummy opening and the contact opening are located in the cell region of the substrate.

22. A method for forming a conductive contact body of an integrated circuit device, comprising:
    forming a plurality of conductive lines including a line-type conductive pattern on a lower dielectric layer on an integrated circuit substrate, a spacer on sides of the conductive pattern, and a hard mask on tops of the conductive pattern;

selectively etching the lower dielectric layer using the hard mask and the spacer as an etching mask to expose the substrate;

forming a stopper layer that covers the hard mask, the spacer and the exposed substrate;

forming a dummy dielectric layer in gaps between the conductive lines on the stopper layer;

patterning the dummy dielectric layer to produce a dummy opening that selectively exposes some of the gaps between the conductive lines;

forming an interdielectric layer pattern in the dummy opening that selectively exposes the dummy dielectric layer;

selectively removing the dummy dielectric layer pattern using the interdielectric layer pattern as an etching mask to form a contact opening that exposes the stopper layer beneath the dummy dielectric layer pattern;

removing the stopper layer that is exposed by the contact opening;

forming a conductive layer in the contact opening and that is electrically connected to the substrate; and etching the conductive layer to separate the conductive layer into conductive contact bodies surrounded by the spacer and the interdielectric layer pattern.

23. The method according to claim 22, further comprising the step of forming a conductive pad electrically connected to an active region of the substrate beneath the lower dielectric layer and exposed by the contact opening.

24. The method according to claim 23, wherein the dummy opening is formed to intersect the conductive lines.

25. The method according to claim 24, wherein the dummy opening is formed without exposing the conductive pad.

26. The method according to claim 22, wherein the conductive contact body is a storage node contact pad, and the conductive pattern is a bit line.

27. A method of conductively contacting an integrated circuit including a plurality of spaced apart lines thereon, comprising:

forming a dummy dielectric layer between first selected ones of the spaced apart lines;

forming an interdielectric layer between second selected ones of the spaced apart lines that are different from the first selected ones of the lines, the interdielectric layer having lower etch rate than the dummy dielectric layer with respect to a predetermined etchant;

etching the dummy dielectric layer with the predetermined etchant to remove at least some of the dummy dielectric layer between the first selected ones of the spaced apart lines; and forming a conductive layer between the first selected ones of the spaced apart lines from which at least some of the dummy dielectric layer has been removed, to electrically contact the integrated circuit between the first selected ones of the spaced apart lines.

28. The method according to claim 27 wherein the forming an interdielectric layer comprises:

blanket forming an interdielectric layer on the dummy dielectric layer and between the second selected ones of the spaced apart lines; and removing the interdielectric layer from the dummy dielectric layer.

29. The method according to claim 27 wherein the forming a dummy dielectric layer is preceded by forming the plurality of spaced apart lines on the integrated circuit substrate by forming a plurality of spaced apart conductive lines on the integrated circuit substrate and by forming a conformal dielectric layer on tops and sides of the plurality of spaced apart conductive lines.

30. The method according to claim 27, wherein the interdielectric layer comprises at least one of silicon dioxide ($SiO_2$), silicon nitride ($Si_3N_4$), silicon carbide (SiC), silicon oxynitride (SiON) and aluminum oxide ($Al_2O_3$).

31. The method according to claim 27, wherein the dummy dielectric layer is comprised of a silicon oxide layer that is coated on the substrate, and the interdielectric layer is comprised of a silicon oxide layer that is chemical vapor deposited (CVD) on the substrate.

32. The method according to claim 31, wherein the silicon oxide layer that is coated comprises at least one of a flowable oxide (FOX) layer and a hydrosilsesquioxane (HSQ) layer.

33. The method according to claim 27, wherein the dummy dielectric layer is comprised of a flowable oxide (FOX) layer, and the interdielectric layer pattern is comprised of at least one of a silicon oxide layer that is deposited on the substrate by high density plasma-CVD, a borophosphosilicate glass (BPSG) layer and a tetraethylorthosilicate (TEOS) layer.

34. The method according to claim 27, wherein the dummy dielectric layer is comprised of a silicon oxide layer that is deposited on the substrate by CVD, and the interdielectric layer comprises silicon nitride ($Si_3N_4$).

* * * * *